(12) United States Patent
Waayers et al.

(10) Patent No.: US 7,945,834 B2
(45) Date of Patent: May 17, 2011

(54) IC TESTING METHODS AND APPARATUS

(75) Inventors: Tom Waayers, Sint Michielsgestel (NL);
Richard Morren, Waalre (NL)

(73) Assignee: NXP B.V., Eindhoven (NL)

( * ) Notice: Subject to any disclaimer, the term of this patent is extended or adjusted under 35 U.S.C. 154(b) by 335 days.

(21) Appl. No.: 12/092,132

(22) PCT Filed: Oct. 18, 2006

(86) PCT No.: PCT/IB2006/053838
§ 371 (c)(1),
(2), (4) Date: Apr. 30, 2008

(87) PCT Pub. No.: WO2007/069097
PCT Pub. Date: Jun. 21, 2007

(65) Prior Publication Data
US 2008/0288842 A1    Nov. 20, 2008

(30) Foreign Application Priority Data

Nov. 2, 2005    (EP) .................... 05110277

(51) Int. Cl.
*G01R 31/28*    (2006.01)
(52) U.S. Cl. ......... 714/729; 714/727; 714/742; 714/724
(58) Field of Classification Search .............. 714/729, 714/727, 742, 724
See application file for complete search history.

(56) References Cited

U.S. PATENT DOCUMENTS

| | | | | |
|---|---|---|---|---|
| 6,242,269 B1 * | 6/2001 | Whetsel | ............ | 438/11 |
| 6,343,365 B1 * | 1/2002 | Matsuzawa et al. | ........... | 714/726 |
| 6,611,934 B2 * | 8/2003 | Whetsel, Jr. | .................. | 714/727 |
| 6,615,380 B1 * | 9/2003 | Kapur et al. | .................. | 714/738 |
| 6,643,810 B2 * | 11/2003 | Whetsel | .................. | 714/724 |
| 6,813,738 B2 * | 11/2004 | Whetsel, Jr. | .................. | 714/727 |
| 6,988,230 B2 * | 1/2006 | Vermeulen et al. | ........... | 714/727 |
| 7,047,467 B1 * | 5/2006 | Khu et al. | .................. | 714/727 |
| 7,401,277 B2 * | 7/2008 | Yamada et al. | ............... | 714/726 |
| 7,409,612 B2 * | 8/2008 | Van De Logt et al. | ........ | 714/727 |
| 7,464,311 B2 * | 12/2008 | Larson et al. | .................. | 714/727 |
| 7,506,231 B2 * | 3/2009 | Chang et al. | .................. | 714/726 |
| 7,539,915 B1 * | 5/2009 | Solt | .................. | 714/726 |
| 7,620,866 B2 * | 11/2009 | Marinissen et al. | .......... | 714/727 |

(Continued)

OTHER PUBLICATIONS

Fang et al., "Power-Constrained Embedded Memory BIST Architecture", 2003, IEEE International Symposium on Defect and Fault Tolerance in VLSI Systems, pp. 451-458.* DaSilva et al., "Overview of the IEEE PI500 Standard", 2003, ITC International Test Conference, pp. 988-997.*

(Continued)

*Primary Examiner* — John J Tabone, Jr.

(57) ABSTRACT

A testing circuit has scan chain segments (62,64,60) defined between parallel inputs (wpi[0] . . . wpi[N−1]) and respective parallel outputs (wpo[0] . . . wpo[N−1]). The scan chain segments comprise a bank (62) of cells of a shift register circuit, a core scan chain portion (62), a first bypass path around the core scan chain portion (62) and a second bypass path around the bank (60) of cells of the shift register circuit. This architecture enables loading of data in parallel into the core scan chain, or into the shift register (WBR). In addition, each scan chain segment also has a series latching element (80), and this provides additional testing capability. In particular, the shifting of data between the latching elements (80) can be used to test the bypass paths while the internal or external mode testing is being carried out. This testing can thus be part of a single ATPG procedure.

21 Claims, 11 Drawing Sheets

U.S. PATENT DOCUMENTS

| | | | |
|---|---|---|---|
| 2003/0101397 A1* | 5/2003 | Whetsel, Jr. | 714/726 |
| 2004/0107394 A1 | 6/2004 | Whetsel | |
| 2004/0199839 A1* | 10/2004 | Whetsel, Jr. | 714/726 |
| 2005/0010832 A1* | 1/2005 | Caswell et al. | 713/330 |
| 2006/0156104 A1* | 7/2006 | Chang et al. | 714/724 |
| 2008/0034334 A1* | 2/2008 | Laouamri et al. | 716/4 |

OTHER PUBLICATIONS

Dervisoglu, "A Unified DFT Architecture for use with IEEE 1149.1 and VSINIEEE P1500 Compliant Test Access Controllers", Jun. 18-22, 2001, DAC 2001, pp. 53-58.*

Li, et al., "Hierarchical Test Scheme for System-on-Chip Designs", Mar. 4-8, 2002, Design, Automation and Test in Europe Conference and Exhibition (DATE'02), pp. 486-490.*

Marinissen, E. J; et al "Infrastructure for Modular SOC Testing" Custom Integrated Circuits Conference, 2004. Proceedings of the IEEE 2004, Oct. 3, 2004, pp. 671-678.

Vermeulen, B; et al "IEEE 1149.1-Complaint Access Architecture for Multiple Core Debug on Digital System Chips" Proceedings International Test Conference 2002. ITC 2002, Oct. 7, 2002, pp. 55-63.

* cited by examiner

IC TESTING METHODS AND APPARATUS

The present invention generally relates to testing of semiconductor integrated circuits, and in particular relates to a core test method and apparatus.

One common testing technique for the testing of semiconductor integrated circuits (ICs) is a scan testing technique. This essentially involves launching a test pattern (termed "vector") into the pins of a device package and monitoring an output response at a specific time, dependent on the clock speed of the device. A set of test vectors is used to enable the behaviour of the device under test to be determined. These vectors are designed to enable detection of manufacturing defects in the device.

As the number of transistors used in integrated circuits grows, the ability to reuse integrated circuit designs becomes increasingly important. One important issue concerning the reuse of design functions (termed "cores") is the ability to test these cores without re-engineering the testing methodology, so that test reuse can be implemented as well as design reuse. The testing of System on Chip (SoC) circuits with multiple functional cores also becomes an increasing challenge.

Primarily to address these issues, the IEEE P1500 working group was formed, and has developed a core level solution to facilitate test integration and test reuse. The standard has now been adopted as IEEE STD 1500 and provides a standard interface and a set of rules defining the boundary between a core and the logic external to the core. This boundary is termed a "wrapper", and allows the isolated test of a core with minimum signals that must be routed outside the system on chip structure. The wrapper comprises so-called "wrapper cells" for each functional input and functional output of the core.

Figure 1:
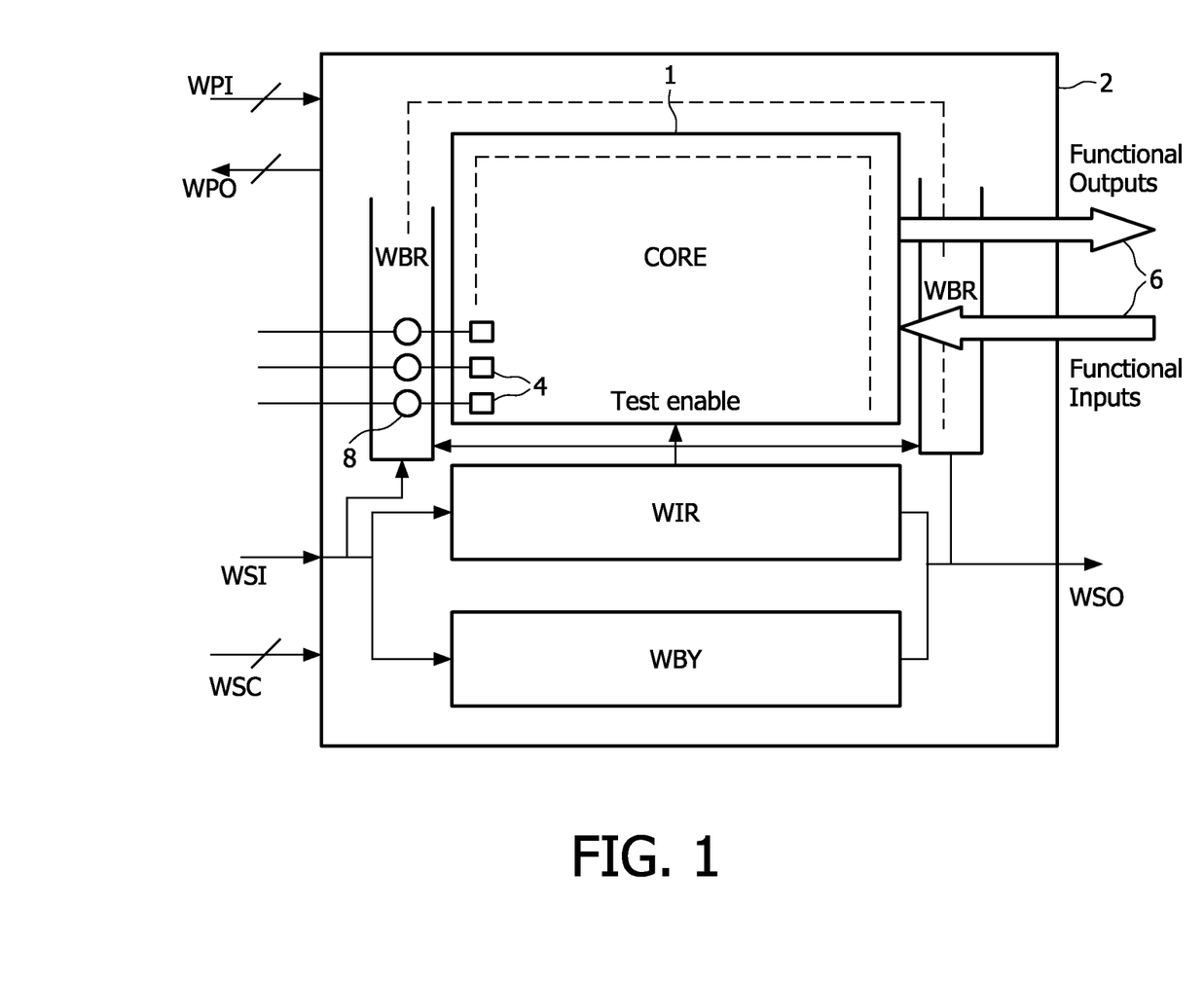
FIG. 1 shows a known testing circuit wrapper for an integrated circuit core.

FIG. 1 shows the basic layout of an IEEE STD 1500 wrapper. The core 1 is surrounded by the wrapper 2, which acts as an interface between all external signals and the core. The wrapper has a wrapper boundary register (WBR) between the core Functional Inputs (FI)/Outputs (FO) and the wrapper functional inputs/outputs. The core terminals are shown as 4, and some of these are functional inputs and some are functional outputs. The standard dictates that the core 1 is defined with unidirectional terminals. The arrows 6 show schematically that the Wrapper Boundary Register acts as the interface between the external functional inputs and outputs and the core functional inputs and outputs.

The Wrapper Boundary Register WBR comprises a chain of cells 8, each associated with an individual functional input or output of the core. These cells are configured into a scan chain to supply the desired test vectors for the control of the core functional inputs or to shift out the results present on the core functional outputs. The cells of the WBR thus essentially implement a scan test technique by providing a selected test vector to the functional inputs and outputs of the core.

The wrapper 2 has a Wrapper Serial Input (WSI) and a Wrapper Serial Output (WSO), and these communicate with an instruction register, termed Wrapper Instruction Register (WIR) and with the Wrapper Boundary Register (WBR).

The Wrapper Boundary Register WBR controls and observes the ports 4 of the functional core. The cells 8 of the WBR are configured in response to the instructions provided to the wrapper instruction register WIR, and the Wrapper Instruction Register essentially controls the testing process.

In particular, the WIR and WBR are configured to operate in response to control signals which indicate the commands "Select", "Capture", "Shift" and "Update".

A shift comprises the advance of the data in the WBR one storage position closer to the test output (and also the advance of data in the WIR or other register). Thus, the shift commands load the WBR cells with the desired test vector.

A capture comprises the storing of the data present on the functional inputs or outputs of the WBR into the WBR cells.

An update comprises storing of the data within the WBR cell shift storage element, using an additional update storage element.

A transfer comprises the movement of data to the WBR cell shift storage element.

Although not shown in FIG. 1, the wrapper receives signals in the form of a Wrapper Capture signal (CaptureWR), a Wrapper Shift signal (ShiftWR) and an Update Wrapper signal (UpdateWR). In addition, the wrapper is controlled by a Wrapper Clock Signal (WRCK), a Wrapper Reset Signal (WRSTN) signal and an Instruction Register Selection signal (SelectWIR).

The Wrapper Instruction Register (WIR) is used to configure the wrapper into a desired mode of operation, determined by the instructions shifted into the WIR. This instruction may be tens or hundreds of bits in length, and can define different test and diagnosis modes of operation. Additional circuitry of the WIR (not shown) is used to interpret the loaded WIR instruction and provide the appropriate control signals to the WBR which controls the interaction with the core.

The wrapper uses the same serial input for the loading of the serial test vectors to be shifted into the WBR cells as for the loading of instruction data, and the SelectWIR signal determines which mode of operation is in use.

The WIR thus decodes loaded instructions and then controls the Wrapper Boundary Register WBR to implement the specified control. The WIR circuitry receives the signals CaptureWR, ShiftWR, UpdateWR and the clock signal WRCK, a reset signal WRSTN signal and the signal SelectWIR, discussed above.

The Wrapper Instruction Register can also control a Wrapper Bypass Register (WBY), which is operable to pass a wrapper serial input (WSI) to the wrapper serial output (WSO) without any interaction with the core. This is in response to a WIR instruction. In addition, an external test can be controlled by the WIR to provide external controllability and observability of the core, and this test involves connecting the Wrapper Boundary Register WBR to the Wrapper Serial Input and Output (WSI and WSO). This enables the loading of customer specified data into the WBR cells.

The Wrapper Instruction Register receives its control input from a Wrapper Serial Control (WSC) input.

The terminals above are from the serial port. The wrapper can also have parallel ports, shown in FIG. 1 as a parallel input port PI and a parallel output port PO.

This invention relates in particular to the testing of multiple cores surrounded by a wrapper. In this case, a path for the test signals needs to be provided between the multiple cores, so that a selected core or cores can be tested using the test signal path. If one particular core is to be tested, the others need to be bypassed, so that the test vectors can be routed to the desired core.

One way to achieve this is to couple scan chains for different wrappers together in series. For the cores which are not to be tested, a bypass is provided around the internal core scan chain, for example using a single shift register bypass element, which is in parallel with the internal core scan chain.

The bypass element can comprise a single latch element which enables the signal being fed along the pipeline to bypass the internal core scan chain and the WBR cells of the wrapper. One problem with this approach is that the different bypass configurations need to be tested for correct functioning, as part of the overall test procedure. As these bypass configurations represent different internal configurations of the wrapper, it is not typically possible to test the different bypass configurations using a single run of an automatic test pattern generation (ATPG) system. Instead, dedicated tests need to be performed to test the different configurations themselves, before the actual core internal and external tests can be performed.

According to the invention, there is provided a testing circuit for the testing of an integrated circuit core or circuitry external to an integrated circuit core, the testing circuit comprising:

a shift register circuit comprising a plurality of cells, for passing test signals, the cells being arranged as a plurality of banks of cells in series;

a serial input and a serial output for connection to the input and output of the shift register circuit;

a plurality of parallel inputs and outputs, wherein the parallel inputs are for passing test signals to the integrated circuit core for testing of the core, wherein a plurality of scan chain segments are defined, each between a parallel input and a respective parallel output, the scan chain segments each comprising a bank of cells of the shift register circuit, a core scan chain portion, a first bypass path around the core scan chain portion and a second bypass path around the bank of cells of the shift register circuit, wherein each scan chain segment further comprises a latching element in series with the bank of cells and the core scan chain portion.

This arrangement essentially uses series elements as part of the bypass mechanism. The bypass paths themselves preferably introduce no delay and can thus comprise a feedforward path around the respective scan chain portion or bank of cells to an output multiplexer.

Thus use of latching elements in series with the core scan chain and shift register cells enables data to be latched between the latching elements while the bypass paths are in use and the circuit is in a test mode. This means that testing of the bypass paths is possible as part of the core internal or external test, and this enables full testing of the core, circuitry external to the core and the wrapper hardware without requiring a dedicated test run for the wrapper bypass structure. Typically one test run will be carried out for core internal test, and one for core external test, and one of these can include the wrapper bypass path testing.

The circuit preferably comprises a first bank of bypass multiplexers which is controllable either to connect integrated circuit core outputs to the multiplexer outputs or to implement the first bypass path.

The circuit preferably comprises a second bank of bypass multiplexers which is controllable either to connect the output of the bank of cells of the shift register circuit to the multiplexer outputs or to implement the second bypass path.

The multiplexers implement zero delay bypass paths (ignoring the signal propagation delay), and the latching elements provide the required latch delay to provide correct timing in a bypass mode The scan chain segments are preferably connectable in series to define a single pipeline between the serial input and serial output. This pipeline connection enables data to be latched between the latching elements of different scan chain segments to enable the testing of the bypass paths set up between the latching elements.

The testing circuit is preferably operable in a shift mode and in a test mode. The shift mode comprises the shifting of data along each scan chain segment, and the test mode has this shifting of data disabled. The shifting of data between the latching elements is however implemented during this test mode, and this therefore has no influence on the data held in the core scan chain or shift register cells. The test modes may include a core internal test mode and a core external test mode.

During the shift mode in advance of a core internal test mode, the parallel inputs may be coupled to the core scan chain portions and the outputs are coupled to the banks of shift register cells. During the shift mode in advance of a core external test mode, the first bypass path is implemented and the parallel inputs are coupled to the banks of shift register cells.

The circuit is operable during a test cycle of either or both of these test modes to implement the first and second bypass paths, and to shift data between successive latching elements, thereby providing testing of the implemented bypass paths.

The shift register circuit can comprise a Wrapper Boundary Register for an embedded core test architecture, for example an IEEE STD 1500 embedded core test architecture.

The invention also provides an IEEE STD 1500 wrapper comprising:

a testing circuit of the invention, the shift register circuit comprising a Wrapper Boundary Register;

a Wrapper Instruction Register; and a Wrapper Bypass Register.

The invention also provides an integrated circuit comprising a circuit core and an IEEE STD 1500 wrapper of the invention. The integrated circuit may comprise a plurality of circuit cores, each with an IEEE STD 1500 wrapper of the invention, and a further wrapper around the plurality of wrapped cores.

The invention also provides a method of testing an integrated circuit core or circuitry external to an integrated circuit core and for testing a series of bypass paths of a testing circuit, the method comprising:

operating the testing circuit in a shift mode in which a test vector is shifted into a set of parallel input ports of the testing circuit, the test vector being provided a core scan chain of the integrated circuit core for testing of the core or to a shift register circuit for testing of the circuitry external to the core;

operating the testing circuit in a test mode to implement the testing of the core or the external circuitry, wherein during the test mode, the core scan chain and shift register circuit are placed in a bypass mode using bypass paths around portions of the core scan chain and portions of the shift register circuit, and the testing circuit is configured to provide a plurality of latching elements and the bypass paths in series between the serial input and output, and wherein data is latched between the latching elements to provide testing of the bypass paths.

This method makes use of the test mode cycle or cycles to perform testing of the bypass paths provided for the core scan chain and shift register of the testing circuit. These bypass paths are required to enable different test modes to be provided and to enable one core to be bypassed within a multiple core arrangement. The testing of the bypass paths can be carried out as part of the core internal or core external test, which can therefore be carried out as a single test pattern procedure.

The shift mode is also used to shift a test result out of a set of parallel output ports of the testing circuit, through the latching elements.

The shift register circuit can comprise a Wrapper Boundary Register for an embedded core test architecture, for example an IEEE STD 1500 embedded core test architecture.

An example of the invention will now be described in detail with reference to the accompanying drawings, in which.

The example of the invention described below provides a wrapper architecture in which the WBR cells are arranged in parallel banks, to support the receipt of parallel data from parallel wrapper ports.

Scan chain segments are defined between each parallel input and a respective parallel output, and the scan chain segments comprise a bank of cells of the shift register circuit, a core scan chain portion, a first bypass path around the core scan chain portion and a second bypass path around the bank of cells of the shift register circuit. This architecture enables loading of data in parallel into the core scan chain, or into the shift register (WBR). In addition, each scan chain segment has a series latching element, and this provides additional testing capability. In particular, the shifting of data between these latching elements can be used to test the bypass paths while the internal or external mode testing is being carried out. This testing can thus be part of a single ATPG procedure.

Before describing the invention in further detail, a more detailed outline of the wrapper structure and operation will be given.

Figure 2:
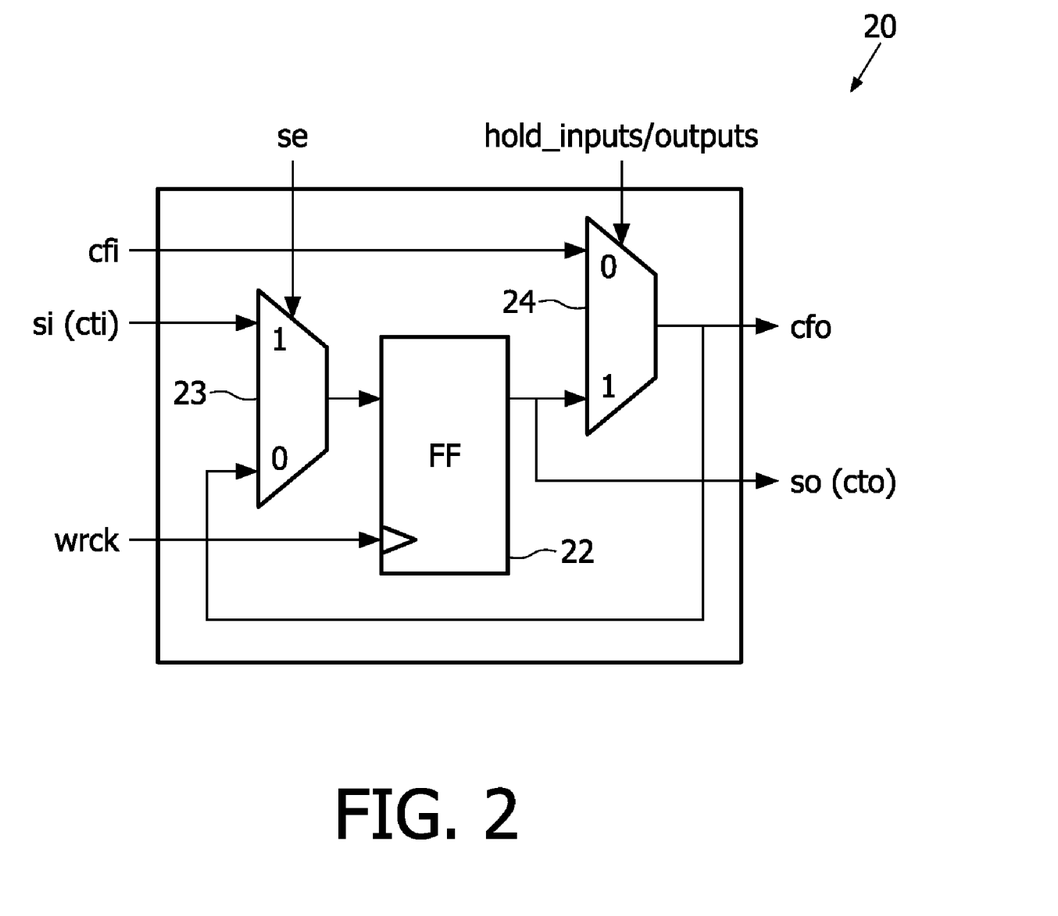
FIG. 2 shows one wrapper boundary cell of the circuit of FIG. 1 in more detail.

As mentioned above, the Wrapper Boundary Register is formed as a plurality of cells, and FIG. 2 shows an example of one such cell 20, corresponding to one of the cells 8 shown in FIG. 1.

This cell can be configured as an input cell or as an output cell. For an input cell, the hold_inputs/outputs signal is "hold_inputs" and for an output cell, the hold_inputs/outputs signal is "hold_outputs".

These hold signals control the WBR cells, and the hold signals are static, to select between core internal (inward facing) and core interconnect (outward facing) tests. The hold signals are generated in response to the interpretation of the WIR instruction, and are controlled in dependence on the selected test (or diagnostic or application) mode. The application mode essentially comprises the disabling of the wrapper to allow normal functionality of the core.

The cell 20 receives a serial input "si", which is the cell test input "cti". This serial input is clocked to the serial output "so", which is the cell test output "cto" by the flip flop 22 when a shift enable control line "se" is high. This shift enable control signal controls a multiplexer 23. The shift enable control line thus controls shifting of signals along the scan chain. Note that the shift enable control lines "se" are related to the command "shiftWR".

For an input cell, in order to provide a signal to the core, in response to a high hold signal at the control line "hold_inputs", the output of the flip flop 22 is provided to the cell functional output "cfo" through multiplexer 24. This is also fed back to the multiplexer 23, and with the shift enable line low, this signal is fed to the flip flop 22 to maintain the cell functional output stable. Thus, a cell test input signal stored in the flip flop is held on the cell test output. The input cell can also observe the environment external to the core, and route this to the serial output.

For an output cell, a signal can be received from the core at the cell function input, and with the hold_outputs signal low, this can be routed (with shift enable low) to the serial output. Similarly, a cell test input can be routed to the cell functional output.

It can be seen that an input cell can provide a test signal to the core, and an output cell can receive a response from the core, and can also provide an outward facing test signal to the circuitry outside the core. These functions are controlled by the hold signal values, which provide the control of the way the WBR operates.

Figure 3:
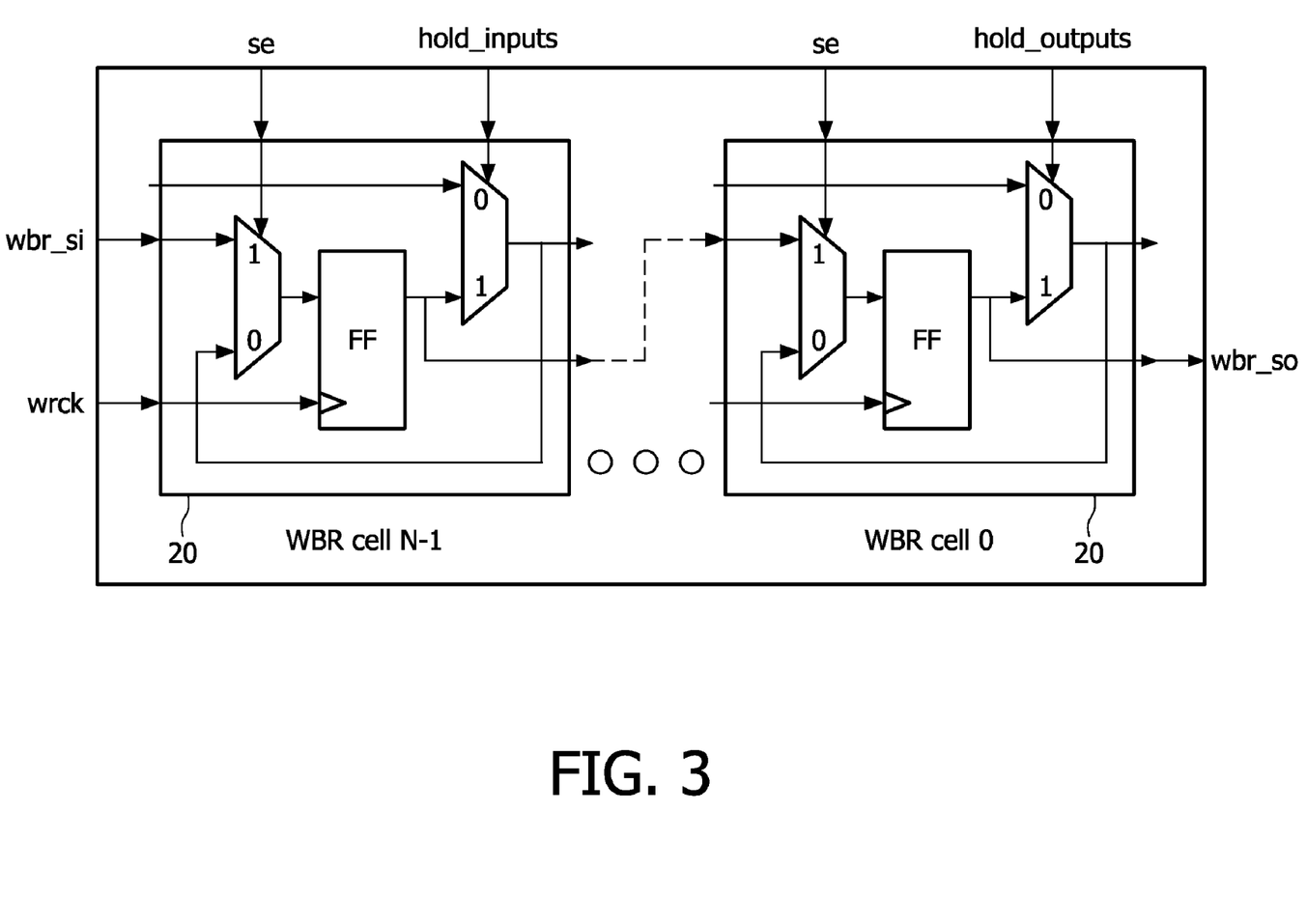
FIG. 3 shows the wrapper boundary register of the circuit of FIG. 1.

FIG. 3 shows multiple cells 20 of FIG. 2 connected in series to define the WBR, which is shown as formed from N cells (numbered 0 to N−1). Some of the cells are configured as input cells (for input terminals of the core) and others are configured as output cells (for output terminals of the core). FIG. 3 thus represents the full WBR shown in FIG. 1.

Figure 4:
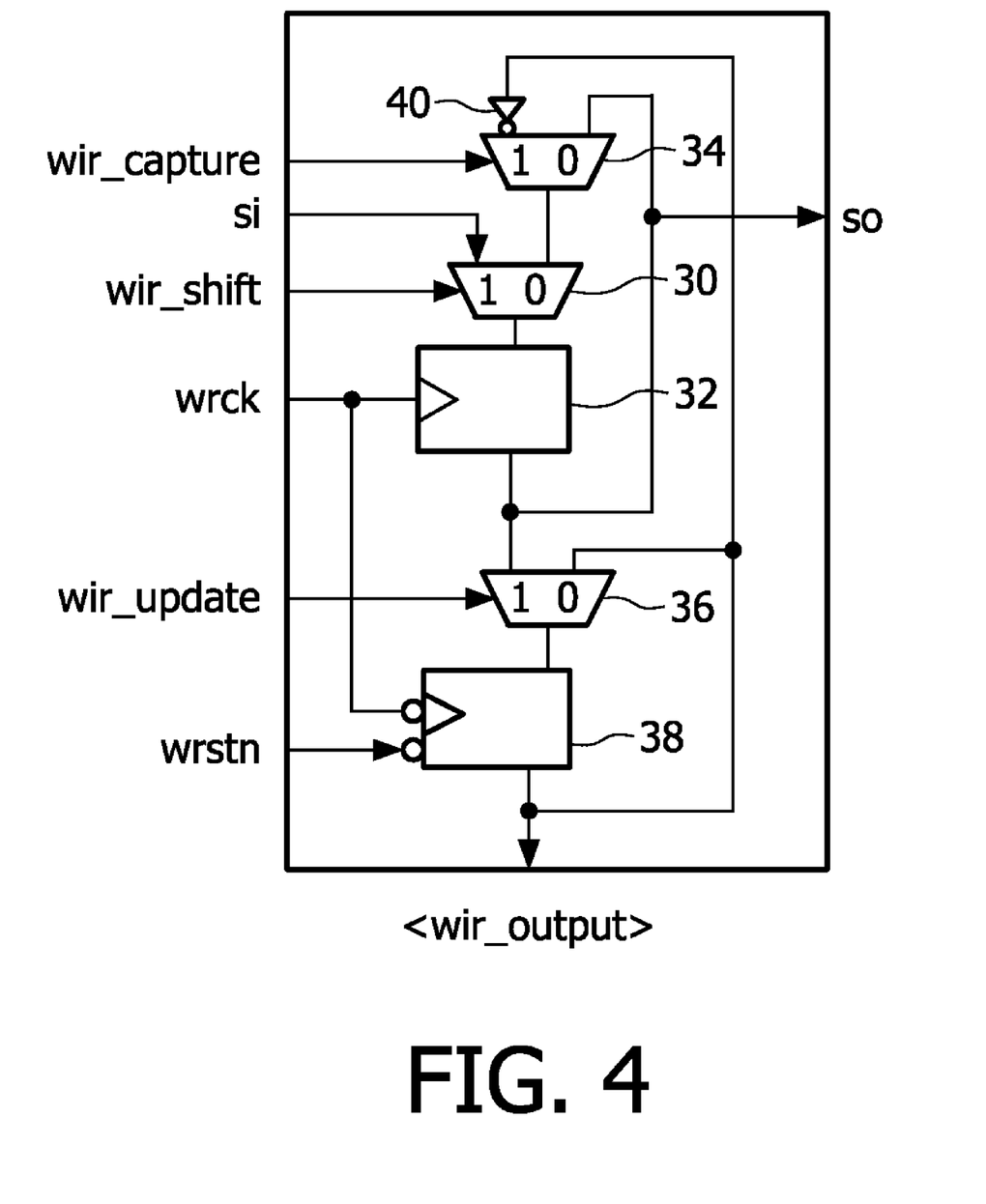
FIG. 4 shows one possible slice architecture for the wrapper instruction register of FIG. 1.

FIG. 4 shows one possible way to implement an instruction register block, forming a building block for the WIR.

FIG. 4 shows the wrapper instruction register "Capture", "Shift" and "Update" signals, as well as the clock "wrck" and reset "wrstn" signals.

The serial input "si" is supplied to the "1" input of a multiplexer 30 which is controlled by the shift signal. When the shift signal is high, this serial input is fed to a first flip flop 32, which clocks the input signal to the serial output "so". This provides a serial chain operation.

The output is also fed back to a second multiplexer 34 which implements the capture function. In the absence of a capture command, the output is fed to the "0" input of the multiplexer 30. This maintains the output stable until the next high shift signal, which replaces the input to the multiplexer 30 with the next serial input value.

The serial output is also provided to a third multiplexer 36, and this passes the output to a second flip flop 38 in response to a high update signal. After an update signal, the output of the flip flop 38 is stable, as the output is fed back to the "0" input of the multiplexer 36. Thus, after the update action, the output of the flip flop 38 is stable and stores the value in the flip flop 32. This defines the wrapper instruction register (WIR) output.

The reset signal resets the WIR output, and the application mode is also implemented (effectively disabling the wrapper) during the reset mode of operation.

It can be seen that the functionality of the circuit shown in FIG. 4 can be selected to:

shift a serial input to the serial output using the shift signal, and through the flip flop 32;

load an "external" signal into the flip flop 32, which can in turn be routed to the flip flop 38 or to the serial output.

In FIG. 4, the flip flop 32 forms part of a serial instruction register, and the flip flop 38 forms part of a parallel update register. Data can be loaded into the update register in parallel and independently of the serial operation. Thus, test mode conditions can be stored in the parallel update register, while a new set of test mode conditions (i.e. an instruction) is loaded into the serial shift register.

The circuit of FIG. 4 has additional test functionality, and for this purpose the WIR output is also fed back to the "1" input of the multiplexer 34, through an inverter 40.

This circuit uses the capture signal as an internal test control. When the capture signal goes high, the inverse of the WIR output is supplied to the multiplexer 30, and this in turn is supplied to the flip flop 32 when there is no shift signal input. This inverted WIR output thus can be controlled to propagate through the structure to the WIR output using the update control signal.

Figure 5:
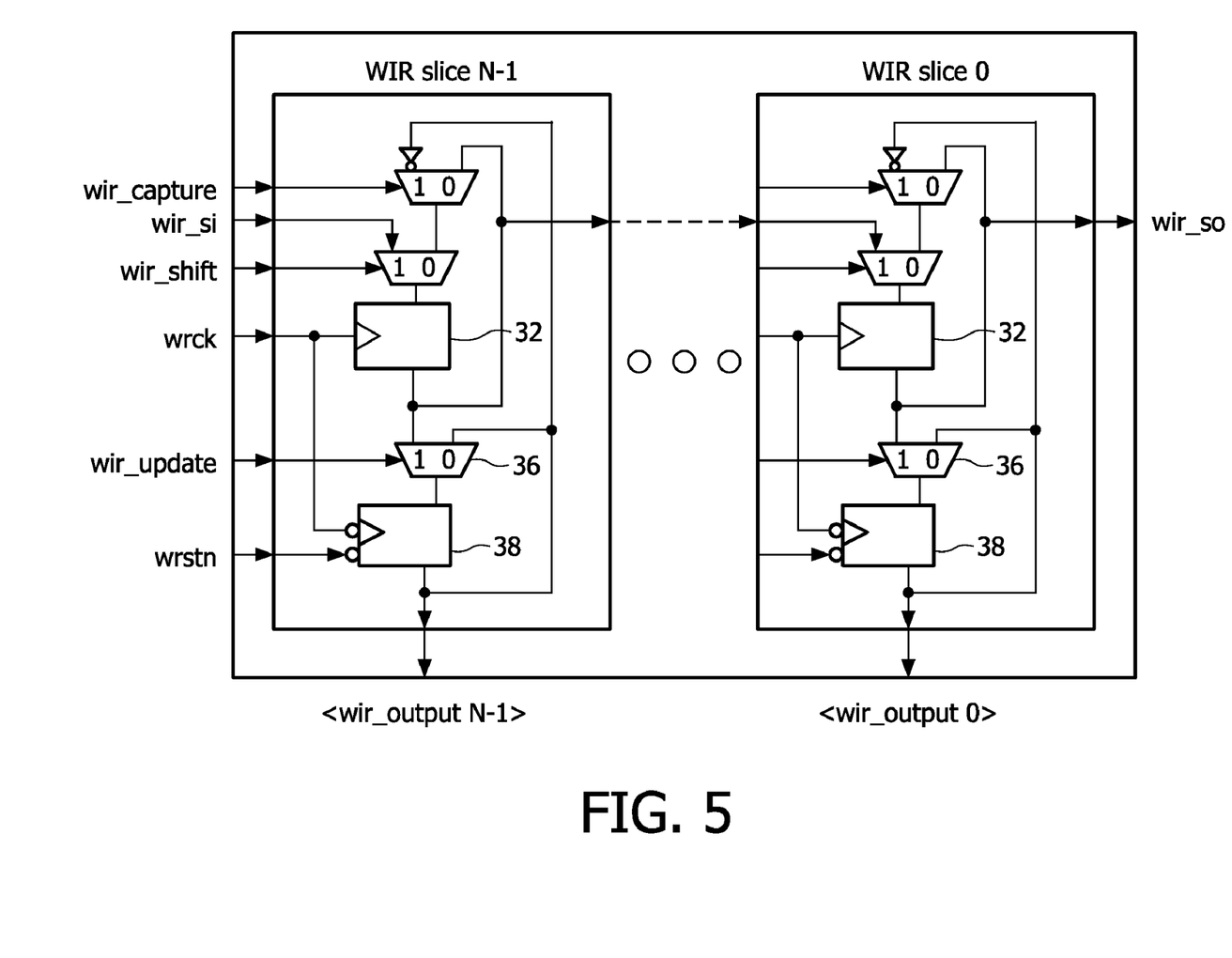
FIG. 5 shows a wrapper instruction register formed using the slices of FIG. 4.

FIG. 4 shows one building block for forming the Wrapper Instruction Register, and FIG. 5 shows the Wrapper Instruction Register formed using the building block of FIG. 5.

As shown, the WIR comprises a series chain of the elements of FIG. 4, with the serial output of one connected to the serial input of the next. All units share the same clock, capture, shift, update and reset signals.

This register provides serial loading of data using the WIR serial input ("si") port and the parallel provision of the WIR output, which can comprise a test vector to be applied to the core under test.

However, the architecture also allows testing of the instruction register, in particular to monitor the propagation of 1s and 0s through the serial flip flops and through the capture and shift multiplexers and the propagation of 1s and 0s through the update flip flops through the update multiplexers. The propagation of 1s and 0s through the series scan chain connections between slices can also be monitored using the serial output.

As mentioned above, the WBR cells are controlled to implement inward facing or outward facing tests (using the hold signals). For efficient core based testing, multiple scan chain configurations are needed to support efficient core internal and core external testing.

For example, multiple cores may be contained within a larger wrapper, and the ability to test a subset of the cores is then desirable, and it is known to enable this using parallel bypass elements around each core.

Figure 6:
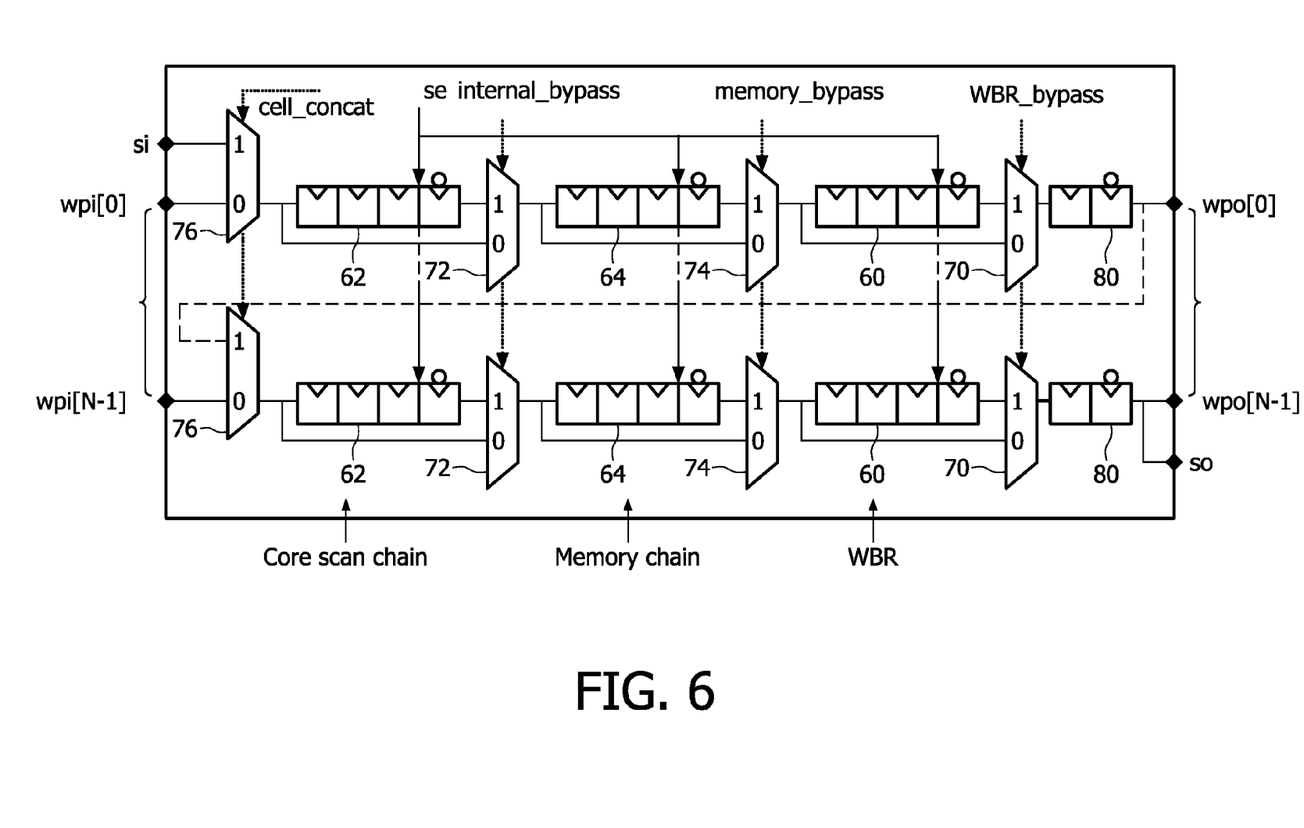
FIG. 6 shows the wrapper configuration of the invention.

FIG. 6 shows a configuration of the invention.

The arrangement of FIG. 6 uses the parallel wrapper inputs to enable multiple test signals to be provided in parallel. FIG. 6 represents a single core.

In FIG. 6, a number N of parallel wrapper inputs wpi[0] to wpi[N−1] are shown. This number is less than the number of WBR cells, so that each parallel input needs to supply data to a subset of the WBR cells. Each block 60 is a sub-chain of the WBR cells.

The internal core scan chain is shown as 62, and this is also represented as a number of blocks. For completeness, a separate memory chain of the internal core is also shown as 64, again represented as a number of blocks.

The internal core scan chains 62, memory chains 64 and the WBR chains 60 are each controlled by a shared shift enable signal "se", which is active during the shifting of data along the pipeline and is inactive during the normal (internal or external) mode test.

Each of the blocks 62, 64, 60 is provided with a multiplexer at its output so that a bypass can be implemented.

The internal core chain blocks 62 each have a multiplexer 72 at their output, and this bank of multiplexers implements an internal core bypass mode, under the control of the signal "internal_bypass". When this bypass signal is low, the multiplexers 72 feed the inputs to the core scan chain blocks 62 directly to the outputs of the multiplexers.

The memory chain blocks 64 each have a multiplexer 74 at their output, and this bank of multiplexers 74 implements a memory bypass mode, under the control of the signal "memory_bypass". When this bypass signal is low, the multiplexers 74 feed the inputs to the memory chain blocks 64 directly to the outputs of the multiplexers.

The WBR cell blocks 60 each have a multiplexer 70 at their output, and this bank of multiplexers implements a WBR bypass mode, under the control of the signal "WBR_bypass". When this bypass signal is low, the multiplexers 70 feed the inputs to the WBR cell blocks 60 directly to the outputs of the multiplexers.

The configuration can also be used to implement a single serial chain between a serial input "si" and a serial output "so", and a further bank of multiplexers 76 is provided for this purpose. This serial chain is of particular interest for a debug operation, in which all data is transported along a serial path, with no internal testing. The multiplexers 76 are controlled by a "cell_concat" control line, which controls the concatenation of the latch cells into a continuous pipeline.

The arrangements of multiplexers enable various bypass configurations to be implemented. However, the correct functioning of these multiplexers and the bypass paths also needs to be tested as part of a test procedure.

The invention provides additional latching elements 80 in series between each parallel input/output pair, wpi and wpo. These latching elements enable both a test function and provide the latching for a bypass mode of operation. They may be considered to be series bypass elements, and they have a simple flip flop latch structure, for forming a link within a sequential scan chain. They introduce a delay of a single clock pulse of the wrapper clock used to clock the latching elements 80.

The elements 80 function as monitoring devices for monitoring the correct operation of the bypass configurations. As they are placed in series with the scan chains, they can be used for monitoring the bypass configuration as part of the core internal or external testing, as will be apparent from the description below. In this way, no additional test configurations are required to enable testing of the bypass multiplexers 72,74,70 and bypass paths.

In the architecture of FIG. 6, each series arrangement between a parallel input and output can be considered as a scan chain segment, which includes a portion 60 of the shift register circuit, a portion 62 of the core scan chain, a portion 64 of the memory chain and one of the latching elements 80.

The table below shows the different test modes which may be used by the circuit of FIG. 6. These test modes are illustrated graphically in FIGS. 7 to 11, which show the data paths through the architecture of FIG. 6, but shown in simplified form without reference numerals. FIGS. 7 to 11 also show the values of the control lines.

|  | se | cell_concat | internal_bypass | memory_bypass | WBR_bypass |
|---|---|---|---|---|---|
| Application | 0 | 0 | 0 | 0 | 0 |
| Intest | S | /S | S | S | S |
| Embedded Test | S | /S | S | S | S |

-continued

|  | se | cell_concat | internal_bypass | memory_bypass | WBR_bypass |
|---|---|---|---|---|---|
| Extest | S | 0 | 0 | 0 | 1 |
| Memory scan test | S | 0 | 0 | 1 | 0 |
| Bypass | 0 | 0 | 0 | 0 | 0 |
| Debug | 1 | 1 | 1 | 1 | 1 |

The table above shows the signals applied to the control inputs discussed above.

The test modes comprise a shifting mode (of multiple clock cycles with se=1) to load the test vector, followed by a test cycle (se=0), followed by a further shifting mode (of multiple clock cycles with se=1) to output the test result. The value S is used to represent the value of se, and /S is the logical inverse.

The first row defines the application mode, in which the wrapper is effectively in a transparent mode. The control signals are all low, so there is no shifting of data along the scan chains. Furthermore, the WBR cells are configured (using the hold inputs) so that they are isolated from the internal core and from the external circuitry, and thereby have no influence on the correct functioning of the wrapped core, which can be in normal operation.

Figure 7:
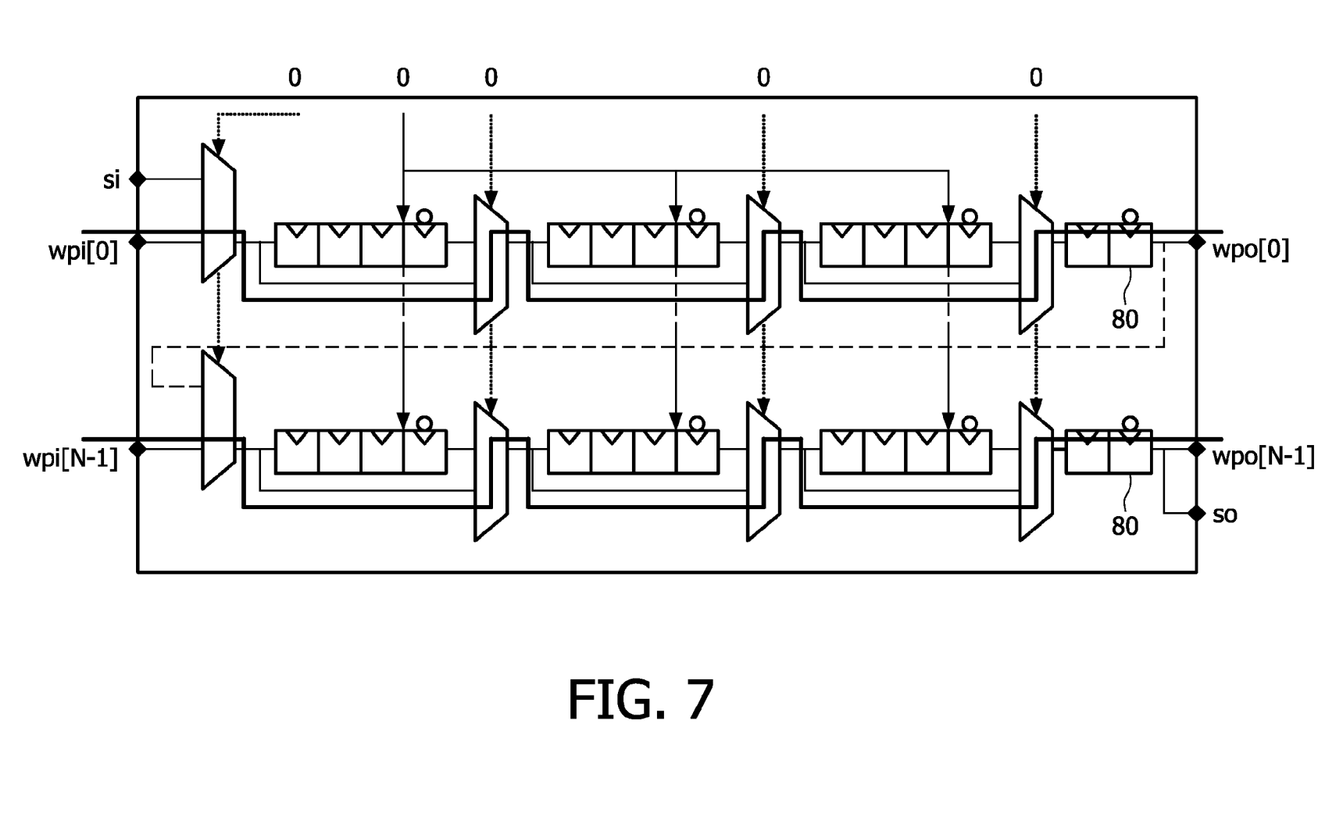
FIG. 7 shows a first operating mode for the wrapper of FIG. 6.

The application mode has the same configuration as a bypass mode, in which the wrapper essentially acts to couple the parallel inputs to the parallel outputs. This can be seen from the sixth row of the table, and FIG. 7 shows the data paths through the structure for these two modes of operation. The bold lines in FIG. 7 represent the data path.

The latch elements 80 introduce a delay of one shift cycle, and this single cycle delay is in any case required in the bypass mode to provide stable and reliable timing. Thus, the arrangement does not introduce additional delay to the bypass mode compared to the conventional bypass mechanism in which a delay bypass element is provided in a feedforward path.

The second row defines a core internal test. This involves scanning a test vector into the core scan chain (with se=1), and subsequently with the scan enable low (se=0), the internal test mode is carried out. During the scanning period, the cell_concat signal is low, so that test vectors provided to the parallel inputs wpi are fed into the scan chains. During the scanning operation, the chains 62,64,60 are connected in series so that data is pipelined along the combined scan chain. The memory chains and WBR wrapper cells are connected in the pipeline as control signals are provided to the memory cells and WBR cells as part of the internal test being carried out.

The other control lines are also varied when switching between the shift and test mode, so that all control lines therefore have dynamic values dependent on the value "S".

During the test operation (S=0), the cell_concat signal is brought high so that the scan chain segments are all connected in series. With the bypass paths all set up (the other three control signals internal_bypass, memory_bypass and WBR_bypass are all low), the test elements 80 are effectively connected in series between the serial input and output si, so.

The normal mode test which is carried out during the test mode typically lasts one wrapper clock cycle, so that during the normal mode test, the data present at the test elements 80 shifts one place along the serial chain. In this way, the bypass paths between each adjacent pair of test elements 80 are tested, and the results of this test are obtained when the data is scanned out during the subsequent serial shift mode.

This approach enables testing of the bypass paths and the correct operation of the multiplexers as part of the ATPG test.

By providing appropriate data values at the positions of the test elements 80 when the internal test mode is carried out, the propagation of 1s and 0s through the bypass paths and the multiplexers can be monitored.

The third row of the table shows the same set of conditions, and this is also suitable for testing of an embedded core. In this case, the parallel inputs wpi[0] . . . wpi[N−1] can be used to provide test vectors for dynamic control of the testing process for embedded cores.

Figure 8:
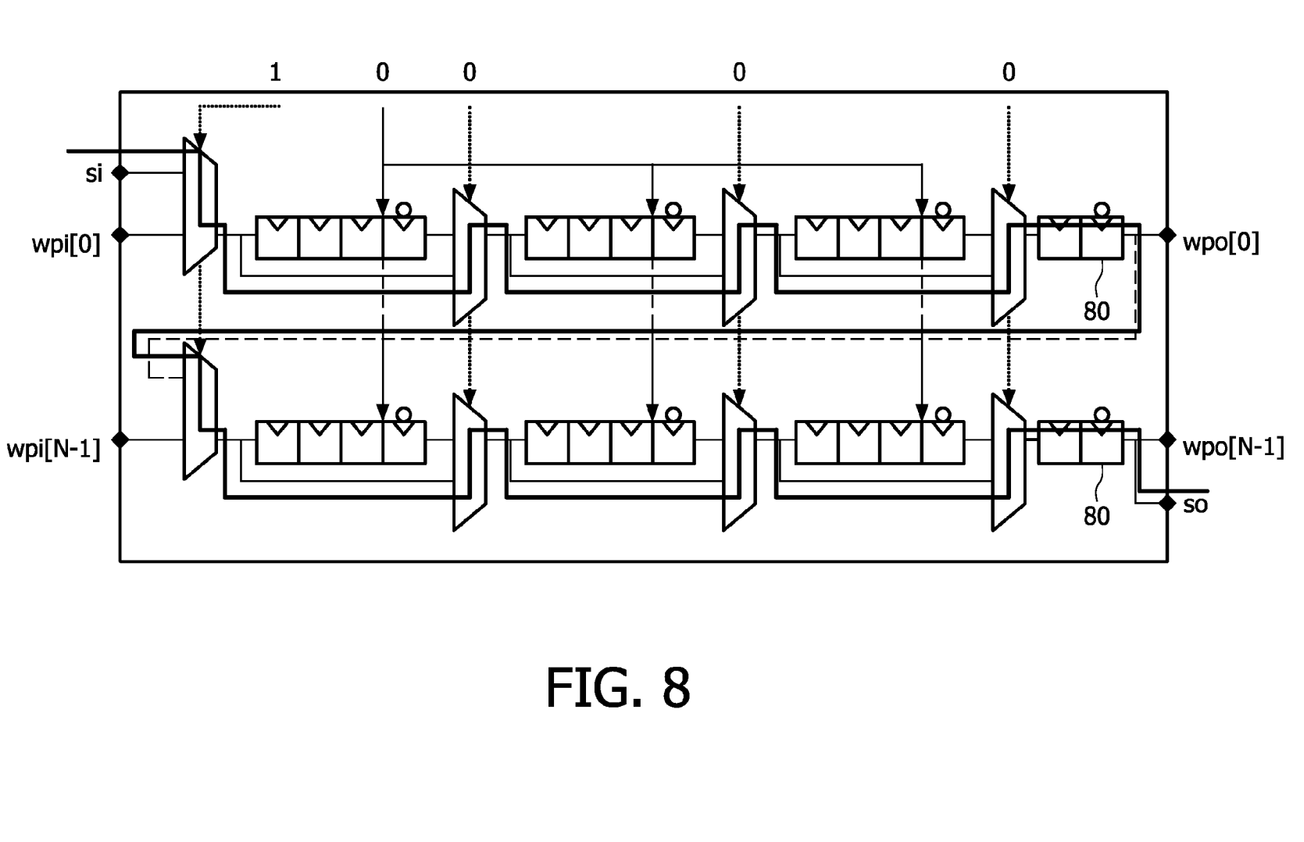
FIG. 8 shows a second operating mode for the wrapper of FIG. 6.

FIG. 8 shows the data path through the structure for the configurations of the second and third rows of the table, and during the internal mode test (i.e. when S=0). During this time, there is no scanning of data along the memory chain, core chain or WBR cells, and therefore no test data is corrupted. Instead, the latching elements enable additional testing of the bypass path configurations as part of the test procedure.

Figure 9:
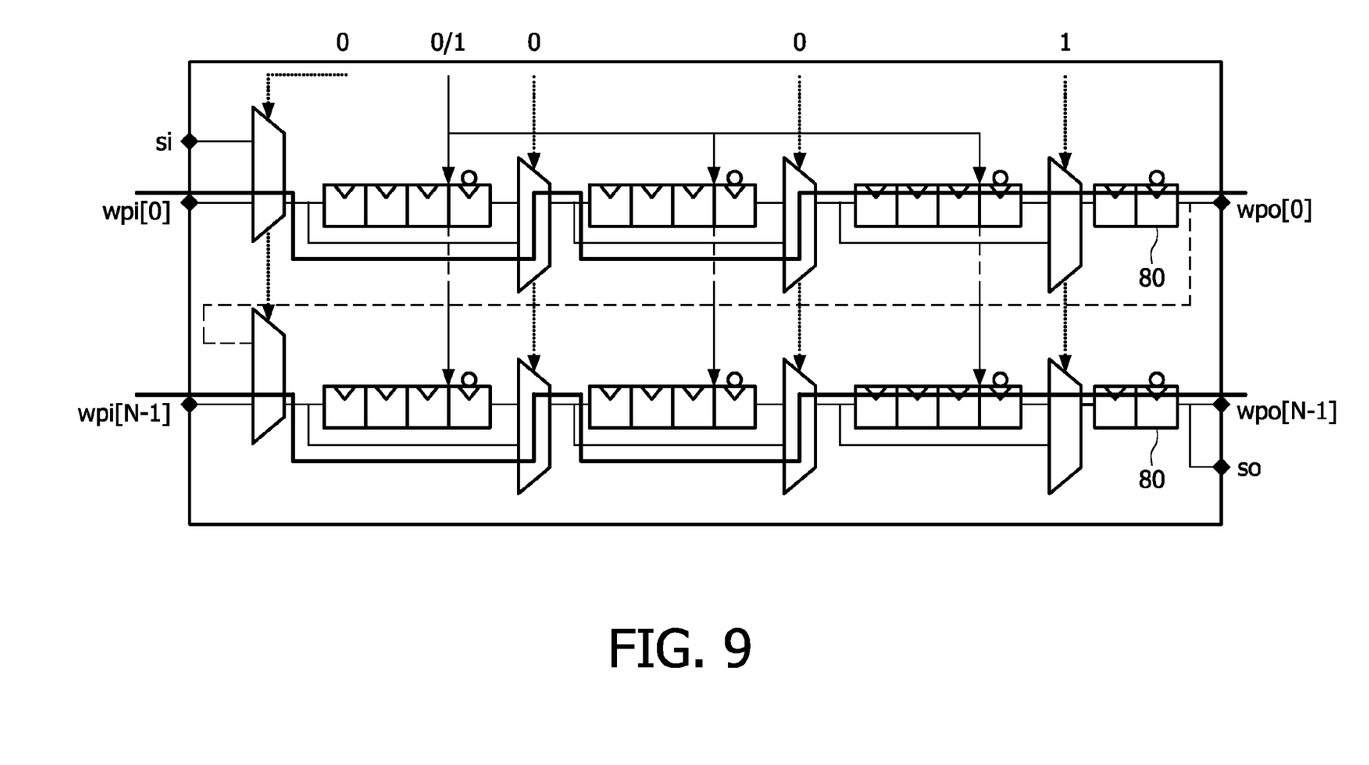
FIG. 9 shows a third operating mode for the wrapper of FIG. 6.

The fourth row shows an external test mode, "extest". This mode connects the WBR chains 60 between the parallel inputs and outputs and bypassing the internal core and memory chains. Thus, the signals cell_concat, internal_bypass and memory_bypass are all low, and the WBR_bypass is high. FIG. 9 shows the data path. The WBR cells are then configured to provide the loaded test vector to the external circuitry surrounding the core.

Figure 10:
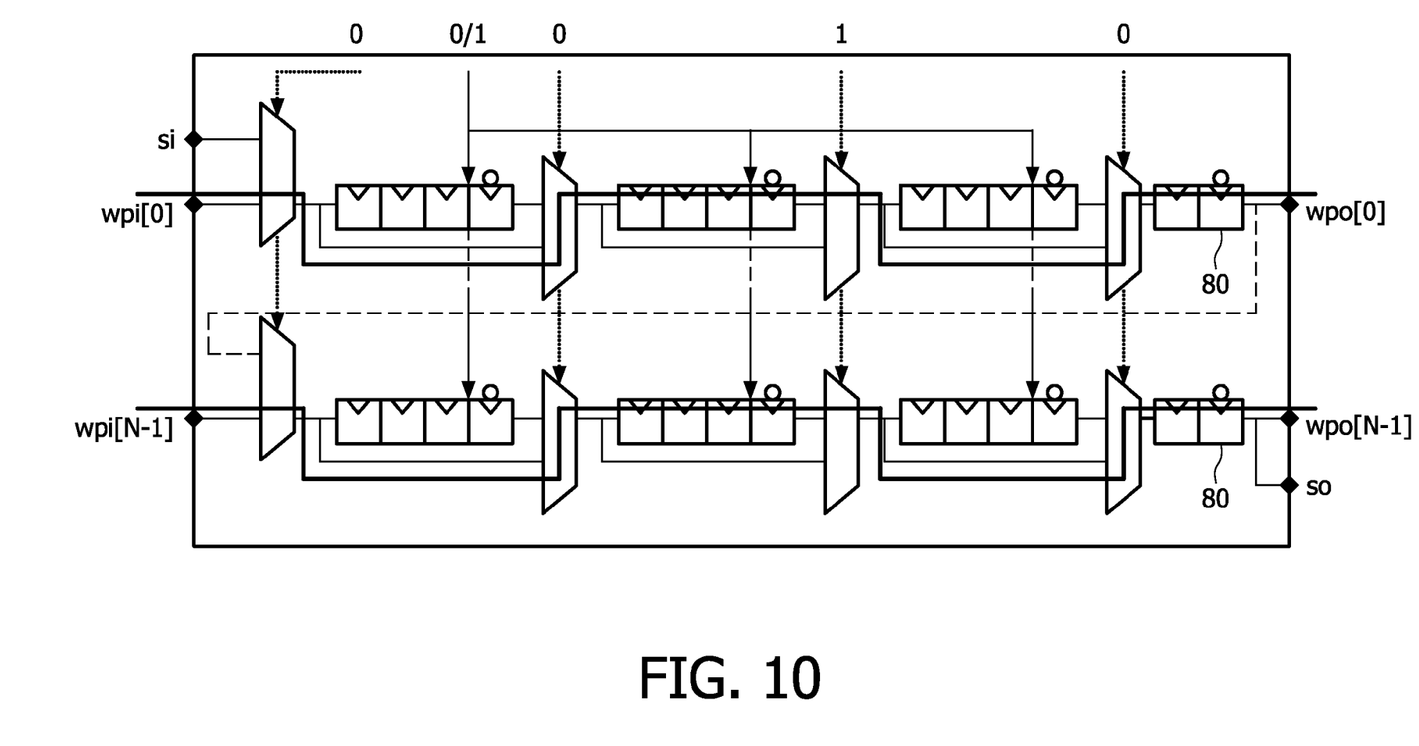
FIG. 10 shows a fourth operating mode for the wrapper of FIG. 6.

The fifth row shows a memory scan test, in which the core scan chains and WBR chains are bypassed and the data path is only through the memory chains (and the latching elements 80), as shown in FIG. 10.

The bypass mode functions in the same way as the application mode, as mentioned above.

Figure 11:
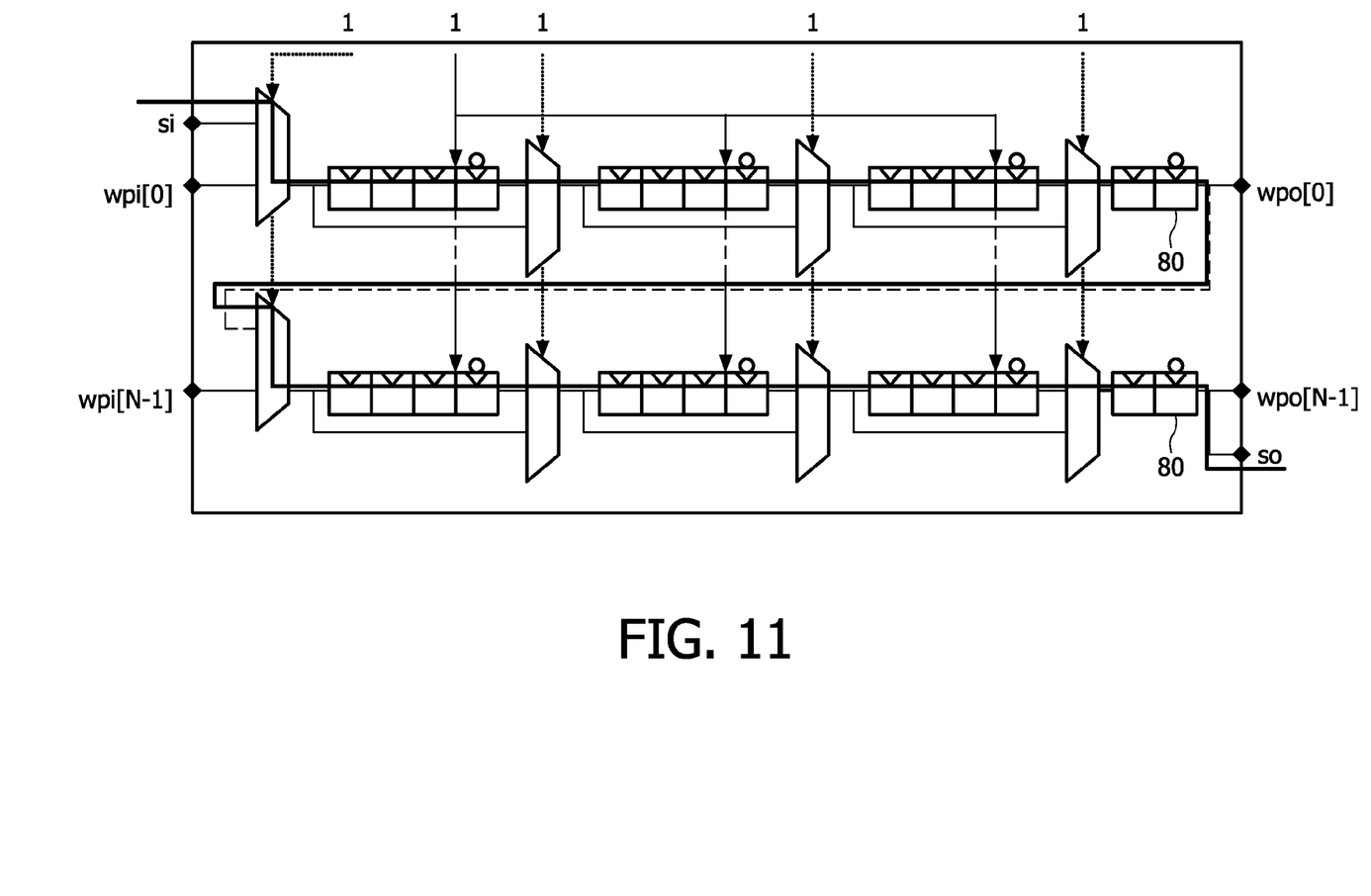
FIG. 11 shows a fifth operating mode for the wrapper of FIG. 6.

The last row of the table is a debug mode, as shown in FIG. 11, in which all data is shifted out of the scan chain in a single serial pipeline. In this case, the cell_concat signal is high, and no bypass paths are implemented, so that all the control signals are high.

In the table above, the testing of the bypass paths has been explained as implemented during a core (internal) test mode. However, this testing may take place during any of the testing modes, when the shift enable line is low and data is not being shifted along the core, memory or WBR cell chains. The testing of the bypass paths will comprise part of the overall test procedure, and can be implemented at different times.

The configuration described above provides efficient modular test, and enables full testing using standard ATPG.

The architecture above also enables the formation of a serial chain for debug data dumps. When in bypass mode, the architecture presents only a single serial element (the latching element 80) between the parallel inputs and outputs, and this supports efficient data transport to neighbouring cores in multiple core architectures. As demonstrated above, the additional test functionality supplements the other test modes and does not preclude other scan chain configurations. The serial placement of the latching elements with the other scan chain configurations provides the ability to provide complete scan chain and bypass testing with standard ATPG.

In the example above, the memory chains are separate from the core scan chains, but this is only by way of example, and they will often be combined.

Although not shown in the figures, the serial input and output will each be connected to a WBR cell for the monitoring of the data provided to and received from the scan chain during the bypass testing part of the test procedure. The data output from the parallel ports is monitored as part of the test process and this provides monitoring of the data values in the latching elements 80, and thereby enables the correct propagation of data into each latching element which was carried out during the test mode to be verified. However, an additional WBR cell is needed at the serial output "so", so that data leaving the last latching element 80 during the test mode can be monitored. Similarly, the data provided to the first scan chain segment is monitored/controlled by a first WBR cell at the serial input "si".

The clocking of the latching elements will typically use the wrapper clock, and this can be independent of the clock signals used during internal or external test modes. Thus, a first clock signal or set of clock signals may be used within the memory chain and the core chain, and a different clock signal can be used for the shifting of data along the WBR cells. The test elements 80 may be clocked using the same WBR cell clock, or an additional clock signal may be used during the testing of the bypass paths, when data is shifted along successive test elements 80. For example, the wrapper clock may be gated and turned off during the test mode, in which case a different clock signal is needed for the latching elements.

The invention has been described with reference to the IEEE STD 1500 wrapper architecture. However, the invention is applicable more generally to registers used in core testing architectures in which parallel and serial inputs are provided.

The term multiplexer has been used above, and this is simply intended to be interpreted as a controllable switching device, in particular for routing one of many inputs to one or more outputs.

In the description and claims, where one port, terminal or signal is described as being for "connection" to another or "coupled" to another, this does not exclude intermediate elements in the path. For example, in FIG. 6, the serial input si can be "connected" to the WBR cells 60 by means of the multiplexers 76, although there are clearly other elements in the path, such as the multiplexers 72 and 74, and (depending on the configuration) the core cell chain 62 and memory chain 64. The terms "connect" and "couple" should be understood accordingly in the claims, with general functional meaning.

The term "zero delay" has been used above, and this should be understood as a delay which is insignificant compared to the clock period, and which therefore does not change the functioning of the circuit. Thus, a zero delay bypass path is a connection which will of course have a propagation delay, but the delay is negligible compared to the delay in a subsequent latch, and the bypass path does not therefore introduce a delay which needs to be taken into account, and can therefore be considered to be zero.

Various other modifications will be apparent to those skilled in the art.

The invention claimed is:

1. A testing circuit for the testing of an integrated circuit core or circuitry external to an integrated circuit core, the testing circuit comprising:
    a shift register circuit comprising a plurality of cells, for passing test signals, the cells being arranged as a plurality of banks of cells in series;
    a serial input and a serial output for connection to the input and output of the shift register circuit;
    a plurality of parallel inputs and outputs, wherein the parallel inputs are for passing test signals to the integrated circuit core for testing of the core,
    wherein a plurality of scan chain segments are defined, each between a parallel input and a respective parallel output, the scan chain segments each comprising a bank of cells of the shift register circuit, a core scan chain portion, a first bypass path around the core scan chain portion and a second bypass path around the bank of cells of the shift register circuit,
    wherein each scan chain segment further comprises a latching element in series with the bank of cells and the core scan chain portion.

2. The testing circuit as claimed in claim 1, comprising a first bank of bypass multiplexers which is controllable either to connect integrated circuit core outputs to the multiplexer outputs or to implement the first bypass path.

3. The testing circuit as claimed in claim 2, comprising a second bank of bypass multiplexers which is controllable either to connect the output of the bank of cells of the shift register circuit to the multiplexer outputs or to implement the second bypass path.

4. The testing circuit as claimed in claim 3, wherein the scan chain segments are connectable in series to define a single pipeline between the serial input and serial output.

5. The testing circuit as claimed in claim 4, wherein the testing circuit is operable in a shift mode and in a test mode.

6. The testing circuit as claimed in claim 5, wherein the testing circuit is operable in a core internal test mode and a core external test mode.

7. The testing circuit as claimed in claim 6, wherein:
    during the shift mode in advance of a core internal test mode, the parallel inputs are coupled to the core scan chain portions and the outputs are coupled to the banks of shift register cells; and
    during the shift mode in advance of a core external test mode, the first bypass path is implemented and the parallel inputs are coupled to the banks of shift register cells.

8. The testing circuit as claimed in claim 5, wherein the testing circuit is operable during a test cycle of one of said test modes to implement the first and second bypass paths, and to shift data between successive series latching elements, thereby providing testing of the implemented bypass paths.

9. The testing circuit as claimed in claim 8, wherein each cell has a serial test input, a serial test output, a functional input and a functional output.

10. The testing circuit as claimed in claim 9, wherein the parallel outputs are defined at the outputs of the latching elements.

11. The testing circuit as claimed in claim 10, wherein the shift register circuit comprises a Wrapper Boundary Register for an embedded core test architecture.

12. The testing circuit as claimed in claim 11, wherein the shift register circuit comprises a Wrapper Boundary Register for a IEEE STD 1500 embedded core test architecture.

13. An IEEE STD 1500 wrapper comprising:
    the testing circuit as claimed in claim 12, the shift register circuit comprising a Wrapper Boundary Register;
    a Wrapper Instruction Register; and
    a Wrapper Bypass Register.

14. An integrated circuit comprising the integrated circuit core and the IEEE STD 1500 wrapper as claimed in claim 13.

15. An integrated circuit comprising a plurality of circuit cores, each with an IEEE STD 1500 wrapper as claimed in claim 13, and a further wrapper around the plurality of wrapped cores.

16. A method of testing an integrated circuit core or circuitry external to an integrated circuit core and for testing a series of bypass paths of a testing circuit, the method comprising:
   operating the testing circuit in a shift mode in which a test vector is shifted into a set of parallel input ports of the testing circuit, the test vector being provided a core scan chain of the integrated circuit core for testing of the core or to a shift register circuit for testing of the circuitry external to the core;
   operating the testing circuit in a test mode to implement the testing of the core or the external circuitry,
   wherein during the test mode, the core scan chain and shift register circuit are placed in a bypass mode using bypass paths around portions of the core scan chain and portions of the shift register circuit, and the testing circuit is configured to provide a plurality of latching elements and the bypass paths in series between the serial input and output, and wherein data is latched between the latching elements to provide testing of the bypass paths.

17. The method as claimed in claim 16, comprising providing a plurality of scan chain segments, each between a parallel input and a respective parallel output, the scan chain segments each comprising a bank of cells of the shift register circuit, a core scan chain portion, a first bypass path around the core scan chain portion and a second bypass path around the bank of cells of the shift register circuit, and the latching element in series with the bank of cells and the core scan chain portion.

18. The method as claimed in claim 16, wherein the shift mode is also used to shift a test result out of a set of parallel output ports of the testing circuit.

19. The method as claimed in claim 18, wherein the test result is shifted out of the parallel output ports through the latching elements.

20. The method as claimed in claim 16, wherein the shift register circuit comprises a Wrapper Boundary Register for an embedded core test architecture.

21. The method as claimed in claim 20, wherein the shift register circuit comprises a Wrapper Boundary Register for an IEEE STD 1500 embedded core test architecture.

\* \* \* \* \*